(12) United States Patent
Ito et al.

(10) Patent No.: US 6,800,914 B2
(45) Date of Patent: Oct. 5, 2004

(54) SEMICONDUCTOR PHOTODETECTOR DEVICE AND MANUFACTURING METHOD THEREOF

(75) Inventors: Kazuhiro Ito, Hinode (JP); Shigehisa Tanaka, Kunitachi (JP); Sumiko Fujisaki, Hachioji (JP); Yasunobu Matsuoka, Hachioji (JP); Takashi Toyonaka, Yokohama (JP)

(73) Assignee: Opnext Japan, Inc., Yokohama (JP)

( * ) Notice: Subject to any disclaimer, the term of this patent is extended or adjusted under 35 U.S.C. 154(b) by 0 days.

(21) Appl. No.: 10/224,115

(22) Filed: Aug. 19, 2002

(65) Prior Publication Data

US 2003/0218226 A1 Nov. 27, 2003

(30) Foreign Application Priority Data

May 24, 2002 (JP) ........................................ 2002-151241

(51) Int. Cl.[7] ..................... H01L 31/107; H01L 27/095; H01L 31/00; H01L 31/06; H01L 31/072
(52) U.S. Cl. ...................... 257/438; 257/466; 257/452; 257/465; 257/199; 257/186
(58) Field of Search .............................. 257/438, 466, 257/452, 465, 199, 186, 458, 461, 646, 623, 603, 605, 656

(56) References Cited

U.S. PATENT DOCUMENTS

| 4,999,696 | A | * | 3/1991 | Gentner et al. | ............. | 257/458 |
| 5,399,885 | A | * | 3/1995 | Thijs et al. | .................... | 257/95 |
| 5,610,416 | A |  | 3/1997 | Su et al. |  |  |
| 5,843,804 | A |  | 12/1998 | Su et al. |  |  |
| 5,866,936 | A |  | 2/1999 | Hasnain et al. |  |  |
| 6,104,047 | A |  | 8/2000 | Watanabe |  |  |

FOREIGN PATENT DOCUMENTS

| EP | 503401 A1 | * | 9/1992 | ......... H01L/31/108 |
| JP | 06-232443 |  | 8/1994 |  |
| JP | 2001-177143 |  | 6/2001 |  |

OTHER PUBLICATIONS

Satoh et al., "APD Receiver Module for 10Gbs High–speed Data Communication," Fujitsu Technical Journal 51:152–155 (2000).

* cited by examiner

Primary Examiner—Nathan J. Flynn
Assistant Examiner—Samuel A Gebremariam
(74) Attorney, Agent, or Firm—Townsend and Townsend and Crew LLP

(57) ABSTRACT

Reducing a dark current in a semiconductor photodetector provided with a second mesa including an regrown layer around a first mesa. An n-type buffer layer, a n-type multiplication layer, a p-type field control layer, a p-type absorption layer, a cap layer made of p-type InAlAs crystal, and a p-type contact layer 107 are made to grow on a main surface of a n-type substrate. Thereafter the p-type contact layer, the p-type cap layer, the p-type absorption layer and the p-type field control layer are patterned to form a first mesa. Next, after making a p-type regrown layer selectively grow around the first mesa or by forming a groove in the regrow layer located in a vicinity of the p-type cap type during a step of the selective growth, the p-type cap layer containing Al and the regrow layer are separated owing to the groove such that no current path is formed between both layers.

20 Claims, 12 Drawing Sheets

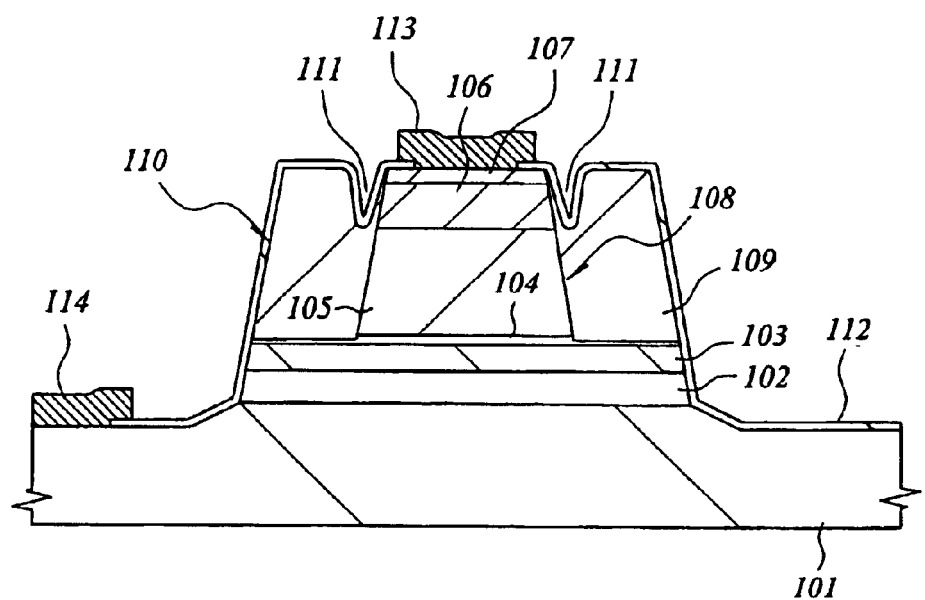
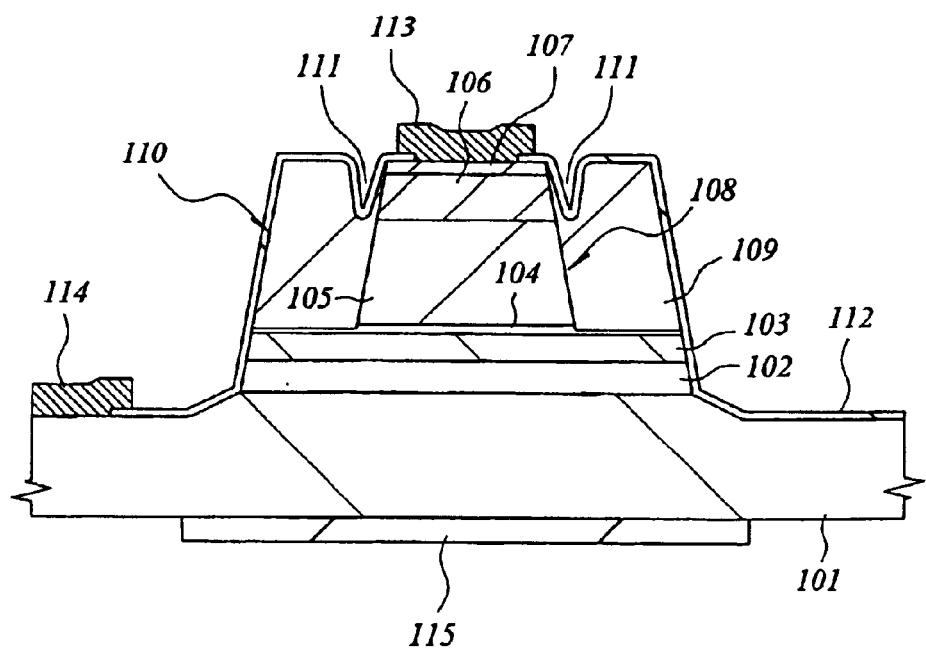

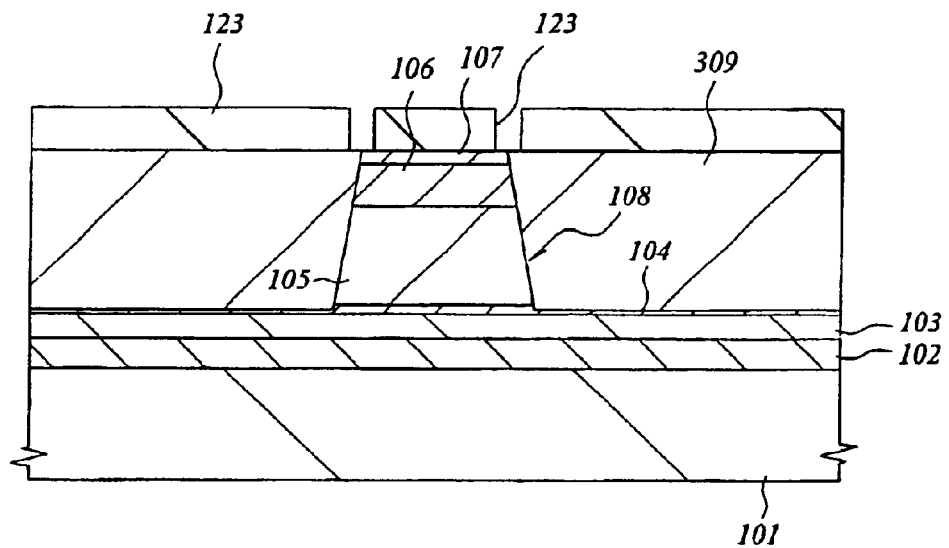
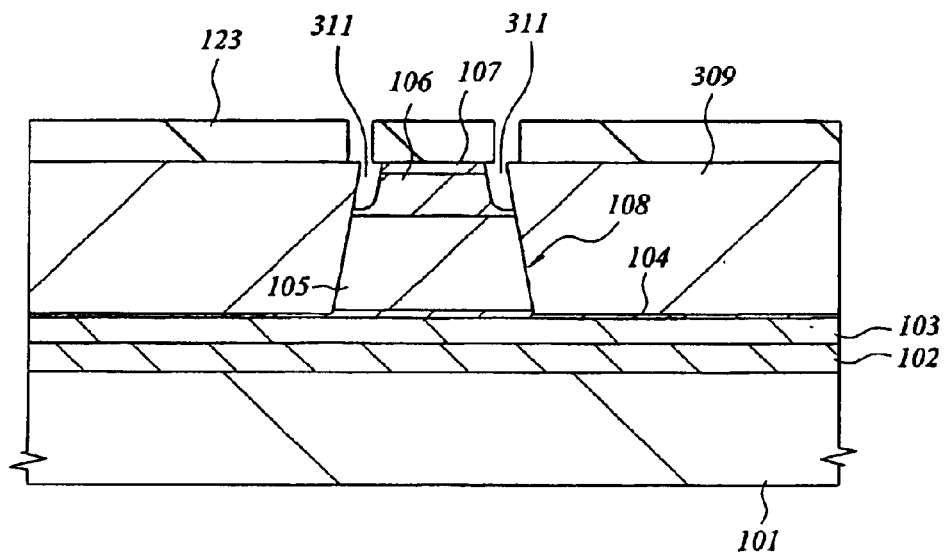

SEMICONDUCTOR PHOTODETECTOR DEVICE AND MANUFACTURING METHOD THEREOF

BACKGROUND OF THE INVENTION

The present invention relates to a semiconductor photodetector device and a manufacturing technique thereof, and particularly to a technique effectively applied to an improvement in reliability of mesa-type photodetector devices employing compound semiconductors.

Japanese Patent Laid-Open No. 2001-177143 discloses a structure in which a mesa is formed on a crystal to be a substratum as a photodetector employing compound semiconductors and a periphery of the mesa is embedded by a crystal made of a suitable material and having a proper carrier density (hereinafter, this structure will be referred to as "embedded mesa-type").

FIG. 21 is a cross-sectional view illustrating an embedded mesa-type semiconductor photodetector described in the above-mentioned document. According to a brief description of a manufacturing method of this semiconductor photodetector, at first, a buffer layer 402 made of an n-type InAlAs crystal; a multiplication layer 403 made of an n-type InAlAs crystal; a field control layer 404 formed of a laminated body of a p-type InAlAs crystal and a p-type InGaAs crystal; an absorption layer 405 made of a p-type InGaAs crystal; a cap layer 406 made of a p-type InAlAs crystal; and a contact layer 407 of a p-type InGaAs crystal are made to sequentially grow on a main surface of a substrate 401 through a MBE (Molecular Beam Epitaxy) method, and thereafter the contact layer 407, the cap layer 406, the absorption layer 405 and the field control layer 404 are etched to form a first mesa 408 on the substrate 401.

Next, a regrown layer 409 having substantially the same height as that of the first mesa 408, made of a compound semiconductor crystal and having a low impurity density is made to grow on the substrate 401, and thereafter the regrown layer 409 and a crystal layer that is a lower layer thereof are etched to form a second mesa 410 around the first mesa 408. Then, a protecting film 412 and electrodes 413 and 414 are formed on the substrate 401 and further an anti-reflection coating 415 is formed on the rear surface of the substrate 401, and thereby the embedded mesa-type semiconductor photodetector is completed.

The embedded mesa-type semiconductor photodetector having the above-mentioned structure has an advantage of being capable of reducing a dark current in comparison with a simple mesa-type semiconductor photodetector not provided with a regrown layer 409 because an electric field intensity of a pn junction (wherein an interface between the multiplication layer 403 and the field control layer 404 is a junction surface) is weakened by the regrown layer 409. Since mechanical strength of each chip is improved by providing, around the first mesa 408, the regrown layer 409 having substantially the same height as that of the first mesa 408, there is also an advantage of allowing bonding to be easily performed to a wiring substrate, or the like.

SUMMARY OF THE INVENTION

In steps of manufacturing the embedded mesa-type semiconductor photodetector described above, the first mesa is formed by laminating crystal layers made of a plurality of kinds of compound semiconductors on the substrate and by patterning these crystal layers. However, since some of these crystal layers also include compound semiconductor crystal containing Al such as InAlAs crystal (for example, a cap layer made of p-type InAlAs crystal), a stable natural oxidization film is formed on the surface of Al exposed to a sidewall of the first mesa by forming the first mesa.

By this, when the regrown layer is made to grow around the first mesa, defects or surface states are formed on the interface between the crystal containing Al and the regrown layer. Especially in the case where there are defects between the cap layer having a high impurity density and the regrown layer having a low impurity density, a current path is formed between both layers, so that the dark current in the photodetector becomes large. An increase in the dark current decreases characteristics of important receiver sensitivity, and so reliability of the photodetector is reduced and, in the case of being remarkably reducing, there are some cases of not functioning as a photodetector.

An object of the present invention is to provide a technique for reducing a dark current in a mesa-type photodetector employing compound semiconductors.

The above and other objects and novel features of the present invention will be apparent from the description of this specification and the accompanied drawings.

Brief descriptions of representative ones among the inventions disclosed in the present application will be made as follows.

A semiconductor photodetector according to the present invention comprises: a pn junction formed by a compound semiconductor layer with first conductivity type formed on a semiconductor substrate and a compound semiconductor layer with second conductivity type formed on an upper portion of said compound semiconductor layer with first conductivity type; a first mesa that is formed in said compound semiconductor layer with second conductivity type and whose no bottom portion reaches said pn junction; a second mesa that is formed in a regrown layer around said first mesa, the regrown layer being made of compound semiconductor crystal surrounding said first mesa, and whose a bottom portion reaches at least said pn junction; and a groove that is provided in a vicinity of the boundary between said regrown layer and said first mesa and whose no bottom portion reaches said pn junction.

A manufacturing method of a semiconductor photodetector according to the present invention includes the following steps (a) to (e) which comprise:

(a) a step of making a compound semiconductor layer with first conductivity type grow on a semiconductor substrate, and of making a compound semiconductor layer with second conductivity type opposite to said first conductivity type, grow on an upper portion of said compound semiconductor layer with first conductivity type;

(b) a step of forming a first mesa having a predetermined shape on an upper portion of said compound semiconductor layer with second conductivity type, and of etching said compound semiconductor layer with second conductivity type located in a region not covered with said first mask, up to such a depth as not to reach an interface of said compound semiconductor layer with first conductivity type;

(c) a step of making a regrown layer made of compound semiconductor crystal grow around said first mesa;

(d) a step of forming a groove by etching a vicinity of the boundary portion between said regrown layer and said first mesa up to such a depth as to reach no interface of said compound semiconductor layer with first conductivity type; and (e) a step of forming a second mesa in each upper portion of said first mesa and said regrown layer located therearound, and of etching said regrown layer located in a region not covered with said second mask and said compound semiconductor layer with second conductivity type located in a lower portion thereof up to such a depth as to reach at least an interface of said compound semiconductor crystal layer with first conductivity type, and of thereby forming, around said first mesa, a second mesa whose a part includes said regrown layer located in a region in which said groove is formed.

According to the above-mentioned means, by providing the groove in a vicinity of the boundary portion between a regrown layer and a first mesa, the compound semiconductor crystal containing aluminum and the regrown layer are separated in the compound semiconductor layer with second conductivity type owing to the groove, and thereby no current path is formed between both layers and so a dark current can be reduced.

FIG. 22 illustrates one example of dark current-voltage characteristics of a semiconductor photodetector provided with a regrown layer around the first mesa, wherein a symbol [A] indicates the case where the cap layer is made of InAlAs crystal, and a symbol [B] indicates the case where the cap layer is made of InGaAs crystal containing no Al for the comparative purpose. As can be seen from the drawing, when an applied voltage is, for example, 25V, [B] is of nA level and [A] is be of $\mu$A level.

BRIEF DESCRIPTION OF THE DRAWINGS

FIG. 7 is a cross-sectional view of a primary portion of a semiconductor substrate for illustrating a manufacturing method of a semiconductor photodetector that is an embodiment of the present invention.

FIG. 8 is a cross-sectional view of a primary portion of a semiconductor substrate for illustrating a manufacturing method of a semiconductor photodetector that is an embodiment of the present invention.

FIG. 17 is a cross-sectional view of a primary portion of a semiconductor substrate for illustrating a manufacturing method of a semiconductor photodetector that is another embodiment of the present invention.

FIG. 18 is a cross-sectional view of a primary portion of a semiconductor substrate for illustrating a manufacturing method of a semiconductor photodetector that is another embodiment of the present invention.

DESCRIPTION OF THE PREFERRED EMBODIMENTS

Figure 1:
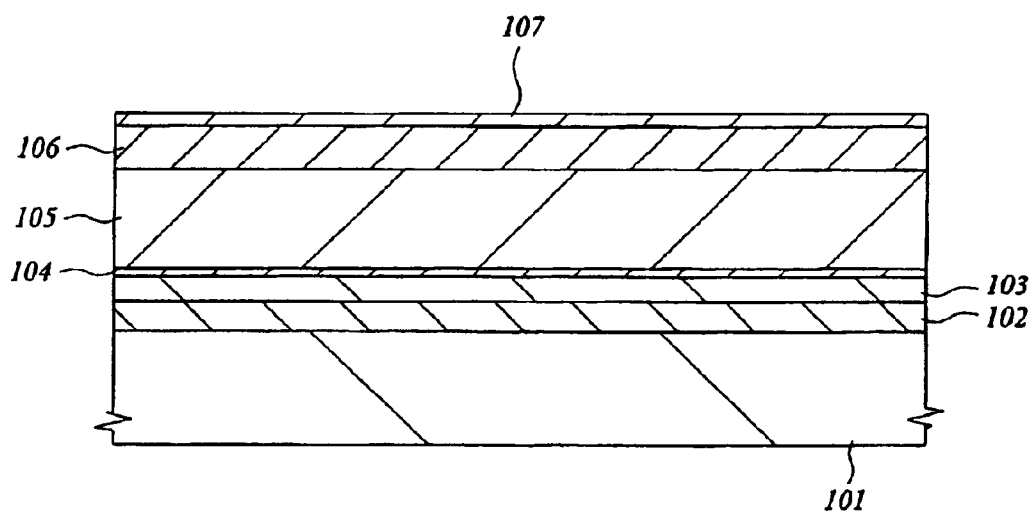
FIG. 1 is a cross-sectional view of a primary main portion of a semiconductor substrate for illustrating a manufacturing method of a semiconductor photodetector that is an embodiment of the present invention.

Embodiments of the present invention will be described in detail and below with reference to the drawings. It is noted that in all of the drawings for describing the embodiments, the same members are denoted by the same reference numerals and the repetitive descriptions thereof will be omitted.

(Embodiment 1)

In the present embodiment, the present invention is applied to a photodetector comprising an avalanche photodiode, and a manufacturing method thereof will be described below with reference to FIGS. 1 to 8.

First, as illustrated in FIG. 1, a substrate 101 made of n-type InP crystal having an impurity density of $1\times10^{18}/cm^3$ is prepared. On the main surface thereof, a buffer layer 102 made of n-type InAlAs crystal (film thickness of 0.5 μm, an impurity density: $1\times10^{18}/cm^3$); a multiplication layer 103 made of n-type InAlAs crystal (a film thickness of 0.3 μm, an impurity density: $1\times10^{14}/cm^3$); a field control layer 104 having a superlattice structure constituted by a laminated body of p-type InAlAs crystal and p-type InGaAs crystal (a film thickness of 0.04 μm, an impurity density: $8\times10^{17}/cm^3$); an absorption layer 105 made of p-type InGaAs (a film thickness of 1.3 μm, an impurity density: $1\times10^{15}/cm^3$); a cap layer 106 made of p-type InAlAs crystal (a film thickness of 0.7 μm, an impurity density: $1\times10^{18}/cm^3$); and a contact layer 107 made of p-type InGaAs crystal (a film thickness of 0.1 μm, an impurity density: $5\times10^{18}/cm^3$) are made to sequentially grow. These compound semiconductor crystal layers (102 to 107) are formed by using a conventionally known MBE (Molecular Beam Epitaxy) method.

Figure 2:
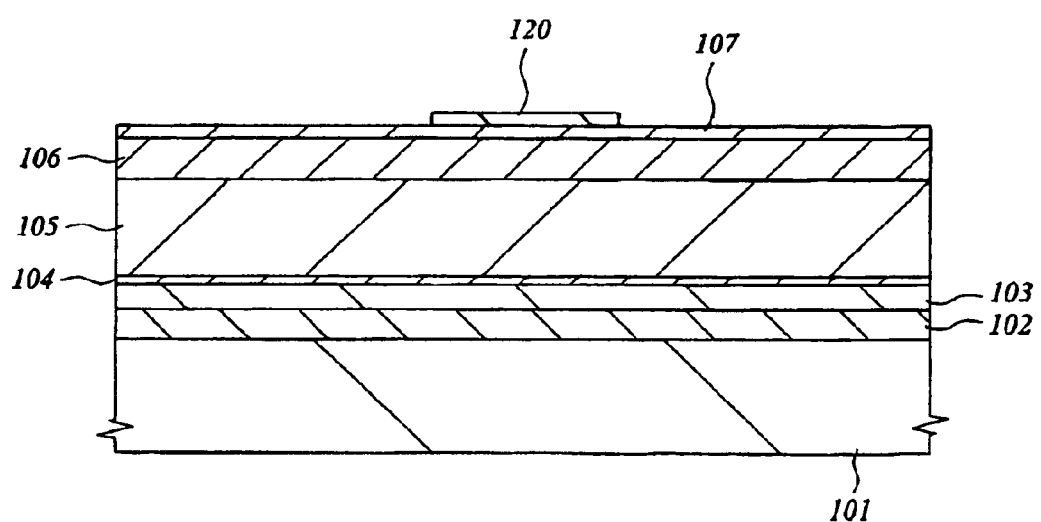
FIG. 2 is a cross-sectional view of a primary portion of a semiconductor substrate for illustrating a manufacturing method of a semiconductor photodetector that is an embodiment of the present invention.

Next, as illustrated in FIG. 2, an oxidized silicon layer deposited on an upper portion of the contact layer 107 by a CVD method is patterned with a conventionally known photolithographic technique, and thereby a hard mask 120 is formed. The hard mask 120 is not shown in the drawings, but the plane shape thereof is a circle and the diameter thereof is 26 μm.

Figure 3:
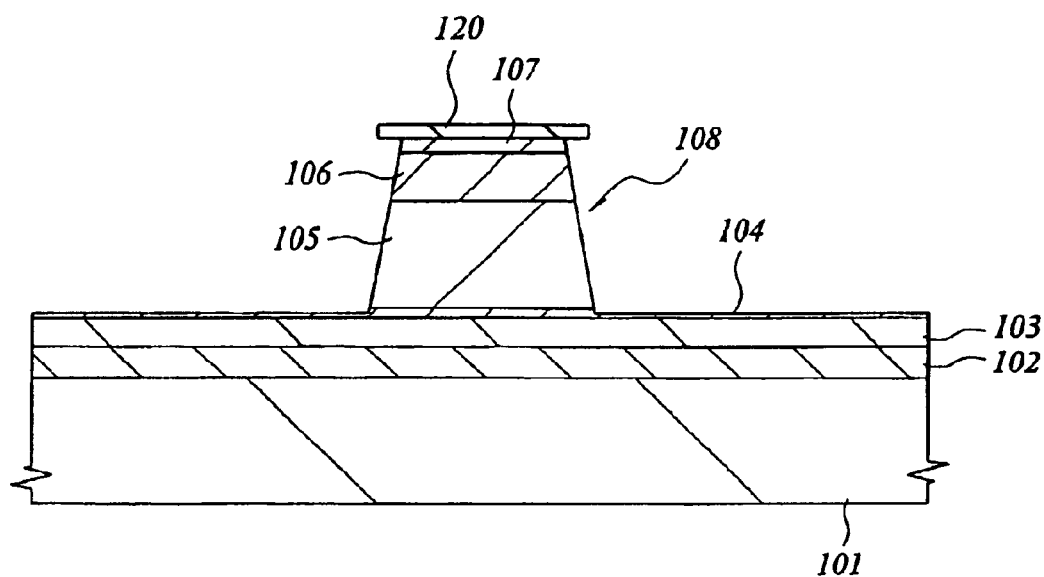
FIG. 3 is a cross-sectional view of a primary portion of a semiconductor substrate for illustrating a manufacturing method of a semiconductor photodetector that is an embodiment of the present invention.

As illustrated in FIG. 3, the hard mask 120 is used as a mask to perform isotropic etching of the contact layer 107, the cap layer 106, the absorption layer 105 and the field control layer 104 by using a phosphoric acid system etching liquid. At this time, the etching is stopped on the way to etch the field control layer 104, such that a pn junction surface (the interface between the field control layer 104 and the multiplication layer 103 located at a lower layer thereof) is not exposed thereto.

By the steps described above, a first mesa 108 is formed on the substrate 101. Each sidewall of this first mesa 108 is inclined at an angle of approximately 80 degrees to the main surface of the substrate 101, and the cap layer 106 containing Al is exposed to a part of each sidewall. Further, when isotropic etching is performed as described above, the compound semiconductor crystal layers (102 to 107) located under the hard mask 120 are side etched and so a peripheral portion of the hard mask 120 overhangs the sidewall of the first mesa 108 by approximately 3 μm.

Figure 4:
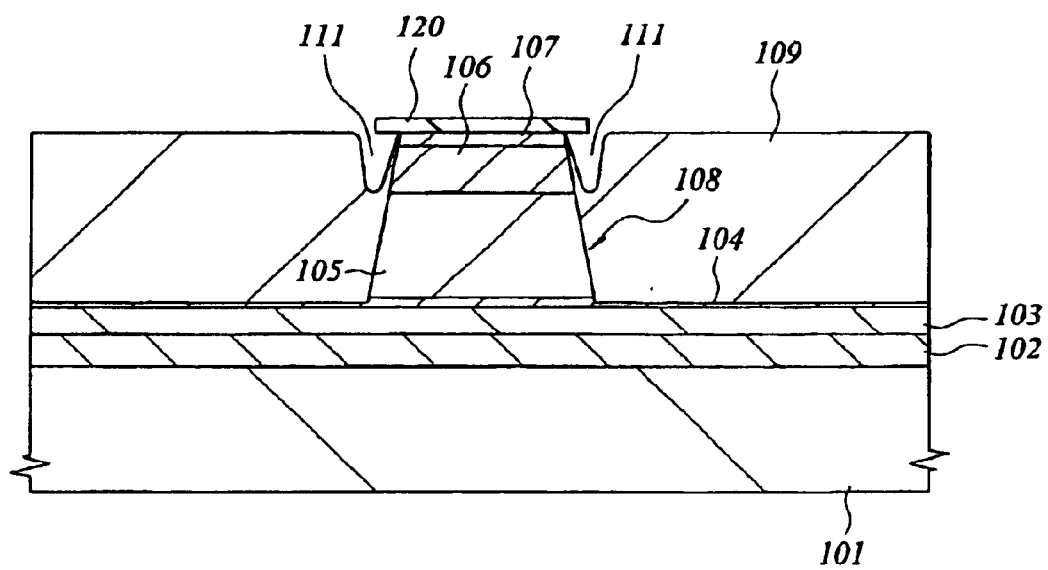
FIG. 4 is a cross-sectional view of a primary portion of a semiconductor substrate for illustrating a manufacturing method of a semiconductor photodetector that is an embodiment of the present invention.

Next, as illustrated in FIG. 4, a regrown layer 109 (a film thickness of 1.9 μm, an impurity density: $5\times10^{15}/cm^3$) made of p-type InP crystal is made to selectively grow on the substrate 101 and around the first mesa 108 with using an MOVPE (Metal Organic Vapor Phase Epitaxy) method. At this time, each groove 111 having a depth of approximately 0.7 μm is formed in the regrown layer 109 located under a lower portion of the hard mask 120 by controlling such a growing condition of the regrown layer 109 that crystal is restrained from growing in a lower region of the hard mask 120 overhanging each sidewall of the first mesa 108.

Figure 5:
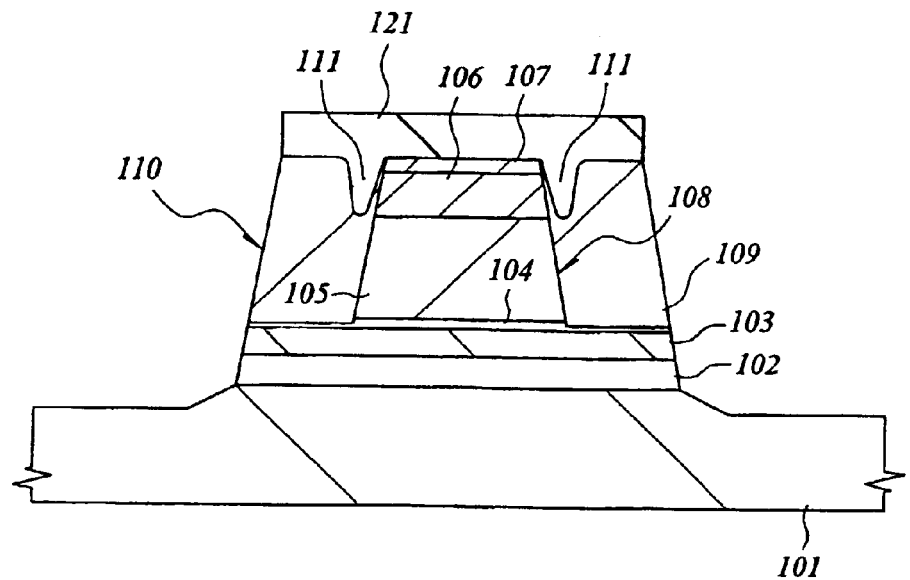
FIG. 5 is a cross-sectional view of a primary portion of a semiconductor substrate for illustrating a manufacturing method of a semiconductor photodetector that is an embodiment of the present invention.

Next, after the hard mask 120 is removed, as illustrated in FIG. 5, a photo-resist film 121 having in plane a circular shape whose a diameter is larger than that of the first mesa 108 and is approximately 40 μm, is formed on each upper portion of the contact layer 107 and the regrown layer 109. This photo-resist film 121 is used as a mask to perform isotropic etching to the contact layer 107, the cap layer 106, the absorption layer 105, the field control layer 104, the multiplication layer 103, the buffer layer 102 and the surface of the substrate 101 by using a Br (bromine) system etching liquid.

By the steps described above, a second mesa 110 is formed over the substrate 101 surrounding the first mesa 108. The second mesa 110 has a planar shape concentric with the first mesa 108, and a pn junction surface (interface between the field control layer 104 and the multiplication layer 103 located under a lower layer thereof) is exposed to a part of each sidewall thereof.

Figure 6:
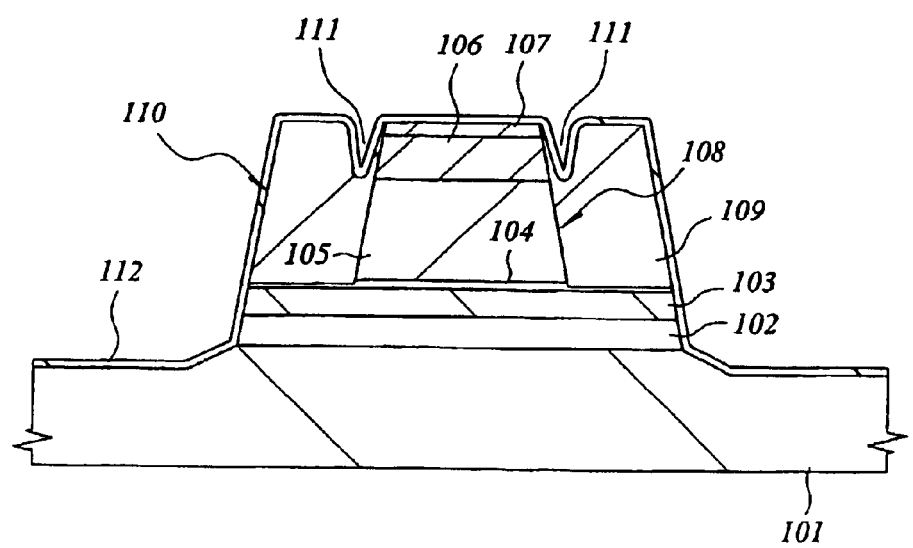
FIG. 6 is a cross-sectional view of a primary portion of a semiconductor substrate for illustrating a manufacturing method of a semiconductor photodetector that is an embodiment of the present invention.

Next, after the photo-resist film 121 is removed, as illustrated in FIG. 6, the entire surface of the substrate 101 is covered by a passivation coating 112. The passivation coating 112 is formed by depositing an silicon oxide film having a film thickness of 0.3 μm and a silicon nitride film having a film thickness of 0.2 μm on and over the substrate 101 through, for example, a CVD method.

Next, as illustrated in FIG. 7, the photoresist film (not shown) is used as a mask to performing dry etching to the protecting film 112, and thereby each part of the contact layer 107 and the substrate 101 are exposed thereto and electrodes 113 and 114 are formed on the exposed parts, respectively. The electrodes 113 and 114 are formed, by patterning a Ti film/Pt film/Au film having a film thickness of 0.5 μm and deposited on the substrate 101 through an Evaporation Method.

Then, as illustrated in FIG. 8, an anti-reflection coating 115 formed of a silicon nitride film having a film thickness of 0.2 μm is formed on a rear surface side of the substrate 101, and thereby a chip of avalanche photodiode is completed. To actually mount this chip on a wiring substrate, for example, the above-mentioned electrodes 113 and 114 are bonded on electrodes corresponding to the wiring substrate through Au/Sn soldering, respectively.

When a reverse bias through electrodes of the wiring substrate was applied to the avalanche photodiode of the present embodiment manufactured in the above-described manner, a breakdown voltage (Vb) thereof was 30V and dark currents corresponding to 27V and 20V were 20 nA and 1 nA, respectively. The multiplication factor of an optical signal also was 90 at maximum. Moreover, a high temperature reverse-bias test was executed for about 1000 hours (with 200° C. and 100 μA constant), and, as a result, each value of the breakdown voltage, the dark current and the multiplication factor had no change and so was good.

For purpose of comparison, when a reverse bias was applied to an avalanche photodiode having a conventional structure in which no groove 111 was formed in the regrown layer 109 around the first mesa 108, the breakdown voltage was 28V and the dark currents corresponding to 27V and 20V were 2 μA and 500 nA, respectively. In the high temperature reverse-bias test, degradation was found in that the breakdown voltage decreased by 2V after 50 hours elapsed and the dark current of 20V increased to 3 μA and the duplicating rate decreased to 10.

The cause of the fact that the difference between the avalanche photodiode of the present embodiment and the avalanche photodiode having the conventional structure occurs in the dark current depends on the number and size of defects in the p-type InP crystal constituting the regrown layer 109. More particularly, since the regrown layer 109 in the conventional structure grew directly from the cap layer 106 of the first mesa 108, 30 to 50 defects each having a length of approximately 2 μm occured inside the regrown layer 109. Meanwhile, no defects were formed inside the regrown layer 109 in the structure of the present embodiment.

This is because when the regrown layer 109 is made to selectively grow, direct growth from the cap layer 106 is restricted in the lower region of the hard mask 120 overhanging each sidewall of the first mesa 108 and diffusive growth from the absorption layer 105 containing no Al in the crystal (p-type InGaAs crystal) becomes dominant.

As described so far, according to the present embodiment, since defects can be remarkably reduced inside the regrown layer 109, an avalanche photodiode having high reliability and small dark currents can be realized.

(Embodiment 2)

Referring to FIGS. 9 to 13, a manufacturing method of an avalanche photodiode according to the present embodiment will be described.

Figure 9:
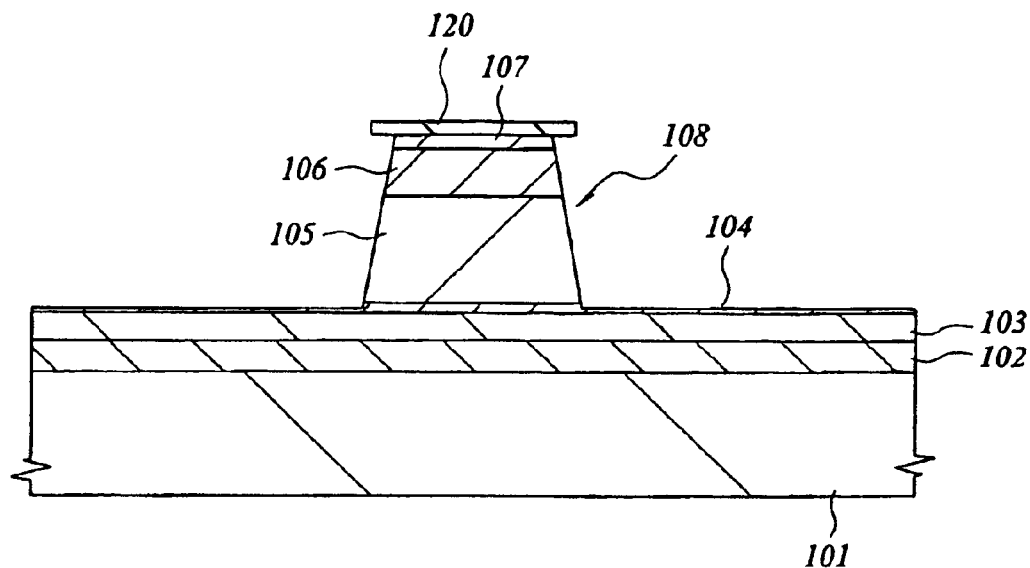
FIG. 9 is a cross-sectional view of a primary portion of a semiconductor substrate for illustrating a manufacturing method of a semiconductor photodetector that is another embodiment of the present invention.

First, as illustrated in FIG. 9, on a main surface of a substrate 101 made of n-type InP crystal, a buffer layer 102 made of n-type InAlAs crystal; a multiplication layer 103 made of n-type InAlAs crystal; a field control layer 104 made of a laminated body of p-type InAlAs crystal and p-type InGaAs; an absorption layer 105 made of p-type InGaAs crystal; a cap layer 106 made of p-type InAlAs crystal; and a contact layer 107 made of p-type InGaAs crystal are made to sequentially grow by using an MBE method. A hard mask 120 made of silicon oxide and formed on an upper portion of the contact layer 107 is used as a mask to perform isotropic etching to the contact layer 107, the cap layer 106, the absorption layer 105 and the field control layer 104. Thereby, a first mesa 108 is formed on the substrate 101. These steps described above are the same as the steps illustrated in FIGS. 1 to 3 of Embodiment 1.

Figure 10:
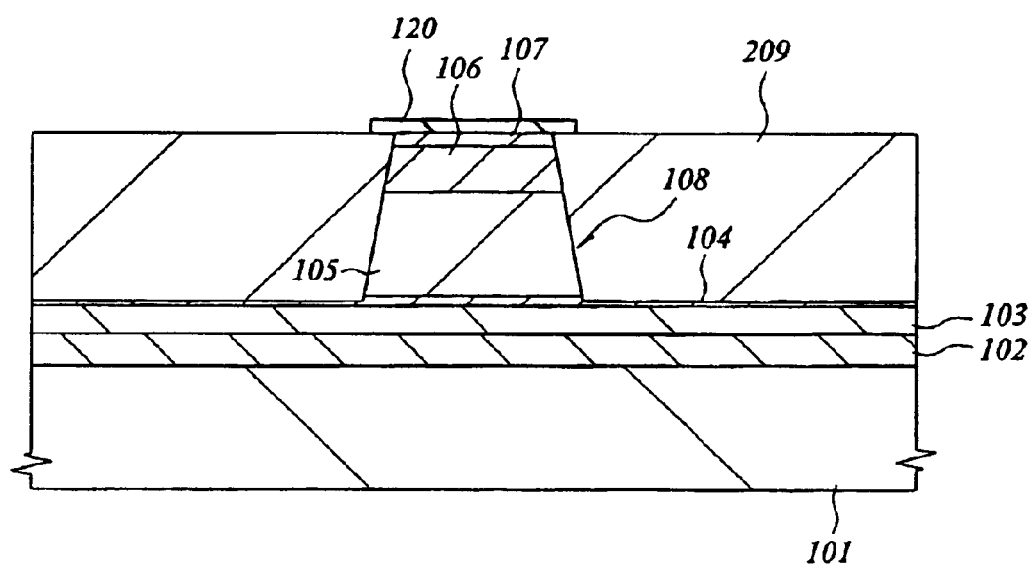
FIG. 10 is a cross-sectional view of a primary portion of a semiconductor substrate for illustrating a manufacturing method of a semiconductor photodetector that is another embodiment of the present invention.

Next, as illustrated in FIG. 10, a regrown layer 209 (a film thickness of 2.2 $\mu$m, an impurity density: $1\times10^{15}/cm^3$) made of p-type InP crystal is made to selectively grow on the substrate 101 around the first mesa 108 through a MOVPE (Metal Organic Vapor Phase Epitaxy) method. At this time, by controlling such growing conditions that the regrown layer 209 is formed also in a lower region of the hard mask 120 overhanging each sidewall of the first mesa 108, the regrown layer 209 is formed so that the entire surface including a vicinity of each sidewall of the first mesa 108 becomes flat. When the regrown layer 209 is made to grow under such condition, a part of the regrown layer 209 directly grow from the cap layer 106 of the first mesa 108 and so defects occur in the regrown layer 209 at the vicinity of the cap layer 106.

Figure 11:
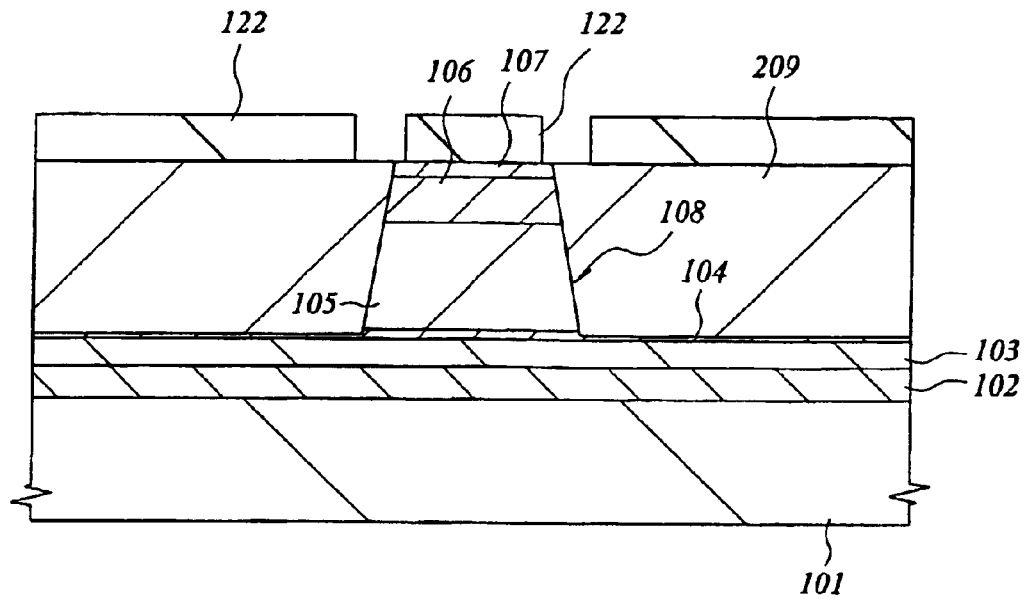
FIG. 11 is a cross-sectional view of a primary portion of a semiconductor substrate for illustrating a manufacturing method of a semiconductor photodetector that is another embodiment of the present invention.

Next, as illustrated in FIG. 11, after the hard mask 120 is removed, a photoresist film 122 to which the regrown layer 209 around the first mesa 108 is exposed is formed on each upper portion of the contact layer 107 and the regrown layer 209.

Figure 12:
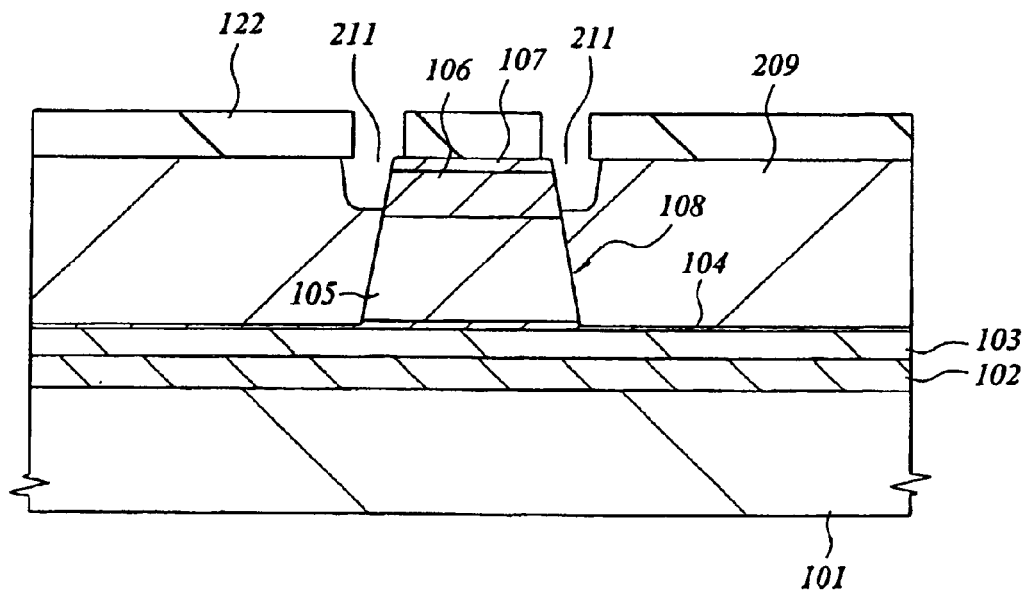
FIG. 12 is a cross-sectional view of a primary portion of a semiconductor substrate for illustrating a manufacturing method of a semiconductor photodetector that is another embodiment of the present invention.

Next, as illustrated in FIG. 12, the above-mentioned photoresist film 122 is used as a mask to perform isotropic etching to the regrown layer 209 around the first mesa 108, and thereby each groove 211 is formed which reaches a bottom portion of the cap layer 106 and has a depth of approximately 1 $\mu$m. This etching is performed such that a chloride system etching liquid is used, and such that the regrown layer 209 is selectively etched and each sidewall of the first mesa 108 is not etched by utilizing the difference between an impurity density of crystal constituting the regrown layer 209 and impurity densities of crystal layers (the contact layer 107 and the cap layer 106) exposed to respective sidewalls of the first mesa 108.

Figure 13:
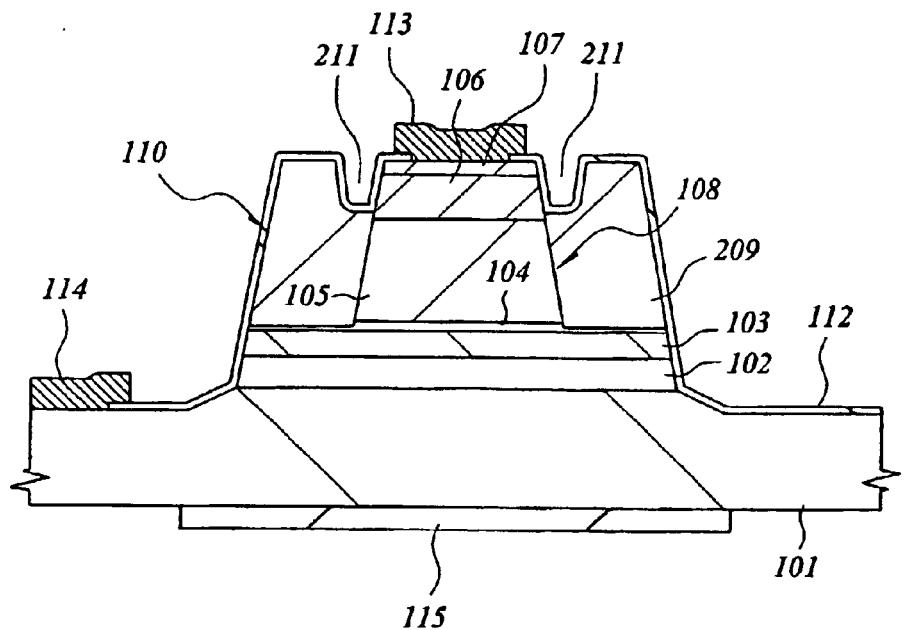
FIG. 13 is a cross-sectional view of a primary portion of a semiconductor substrate for illustrating a manufacturing method of a semiconductor photodetector that is another embodiment of the present invention.

Next, after the photoresist film 122 is removed, as illustrated in FIG. 13, a second mesa 110, a protecting film 112 and electrodes 113 and 114 are formed on and over the substrate 101 and a reflection protecting film 115 is formed on a rear surface of the substrate 101, in accordance with the steps illustrated in FIGS. 5 to 8 of Embodiment 1 described above, and thereby an avalanche photodiode chip is completed.

When a reverse bias through electrodes of the wiring substrate was applied to the avalanche photodiode that is the present embodiment and that is manufactured by the above-described manner, a breakdown voltage (Vb) thereof was 30V and a dark current corresponding to 27V was 10 nA and a multiplication factor of optical signals was 90 at maximum. Also, a high temperature reverse-bias test was executed for about 1000 hours (with 200° C. and 100 $\mu$A constant), and, as a result, each value of the breakdown voltage, the dark current and the multiplication factor had no change and was good.

In the avalanche photodiode of the present embodiment, while the regrown layer 209 grows, a part thereof directly grows from the surface of the cap layer 106 and so defects occur in the inside thereof. However, each groove 211 is formed in the regrown layer 209 surrounding the cap layer 106 by the steps performed later, and thereby the cap layer 106 and the regrown layer 209 are made non-continuous. Therefore, no current path is formed between the cap layer 106 and the regrown layer 209, and, as a result, an avalanche photodiode having high reliability and a small dark current can be realized.

(Embodiment 3)

Figure 14:
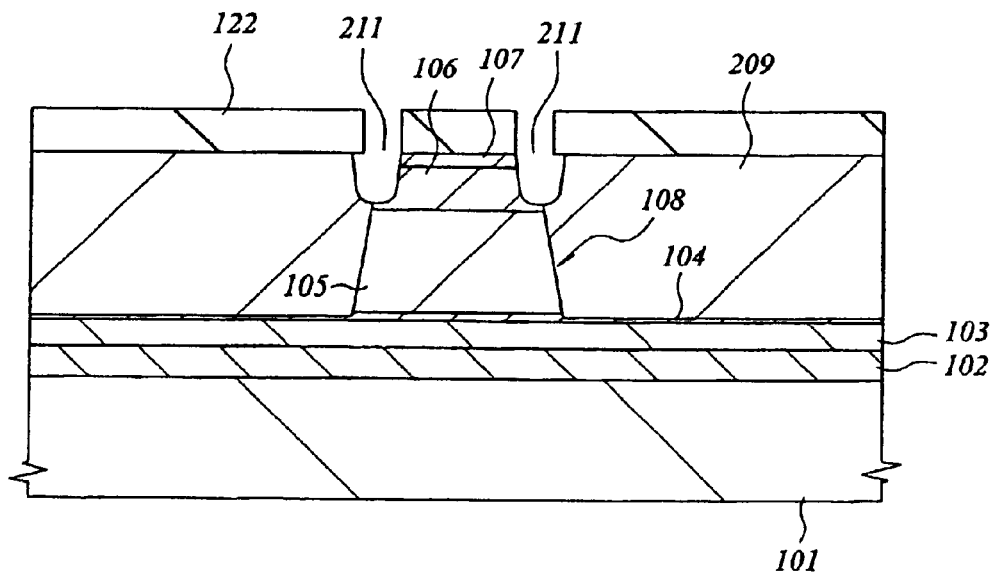
FIG. 14 is a cross-sectional view of a primary portion of a semiconductor substrate for illustrating a manufacturing method of a semiconductor photodetector that is another embodiment of the present invention.
Figure 15:
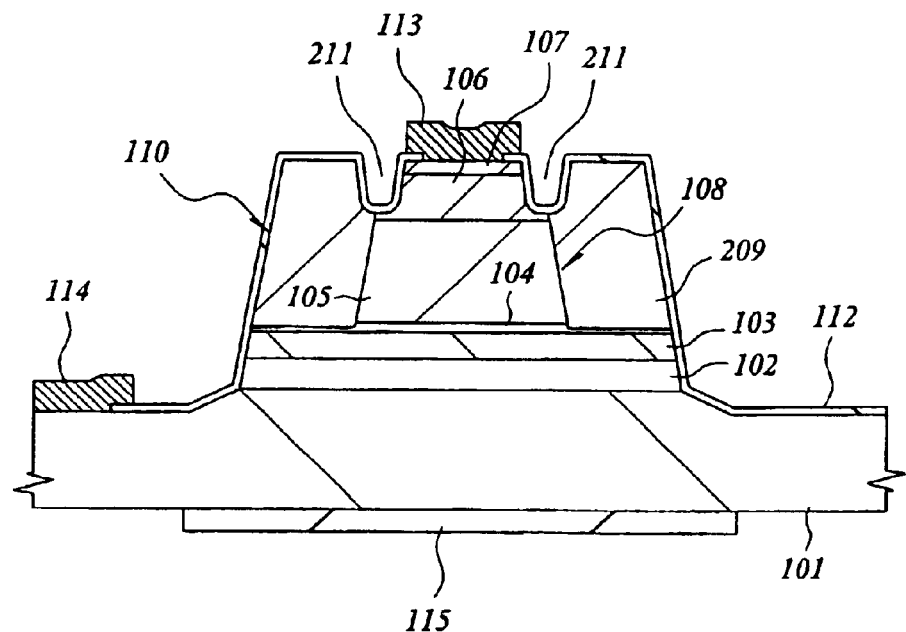
FIG. 15 is a cross-sectional view of a primary portion of a semiconductor substrate for illustrating a manufacturing method of a semiconductor photodetector that is another embodiment of the present invention.

In the manufacturing method of Embodiment 2 described above, when the regrown layer 209 around the first mesa 108 is etched to form the groove 211, such etching condition is selected (see FIG. 12) that the sidewall of the first mesa 108 is not cut. However, as illustrated in FIG. 14, with a Br (bromine) system etching liquid, each part of the contact layer 107 and the cap layer 106 that are exposed to the sidewall of the first mesa 108 may be etched along with the regrown layer 209 to form the grooves 211. Thereafter, as illustrated in FIG. 15, a second mesa, a passivation coating 112 and electrodes 113 and 114 are formed on and over the substrate 101 and a reflection protecting film 115 is formed on the rear surface of the substrate 101, and thereby the avalanche photodiode chip is completed.

When a reverse bias through the electrodes of the wiring substrate was applied to the avalanche photodiode that is the present embodiment and that is manufactured in the above-described manner, a breakdown voltage (Vb) thereof was 30V and a dark current corresponding to 27V was 10 nA and a multiplication factor of an optical signal was 90 at maximum, similarly to the avalanche photodiode of Embodiment 2. A high temperature reverse-bias test was executed for about 1000 hours (with 200° C. and 100 $\mu$A constant), and, as a result, each value of the breakdown voltage, the dark current and the multiplication factor had no change and was good.

In the avalanche photodiode of the present embodiment, similarly to the avalanche photodiode of Embodiment 2 described above, a part of the regrown layer 209 directly grow from the cap layer 106 in the step of forming the regrown layer 209 and so defects occur in the inside thereof. However, each groove 211 is formed in the regrown layer 209 surrounding the cap layer 106 by the steps performed later, and thereby the cap layer 106 and the regrown layer 209 are made non-continuous. Therefore, no current path is formed between both layers and an avalanche photodiode having high reliability and a small dark current can be realized.

(Embodiment 4)

Referring to FIGS. 16 to 19, a manufacturing method of an avalanche photodiode according to the present embodiment will be described.

Figure 16:
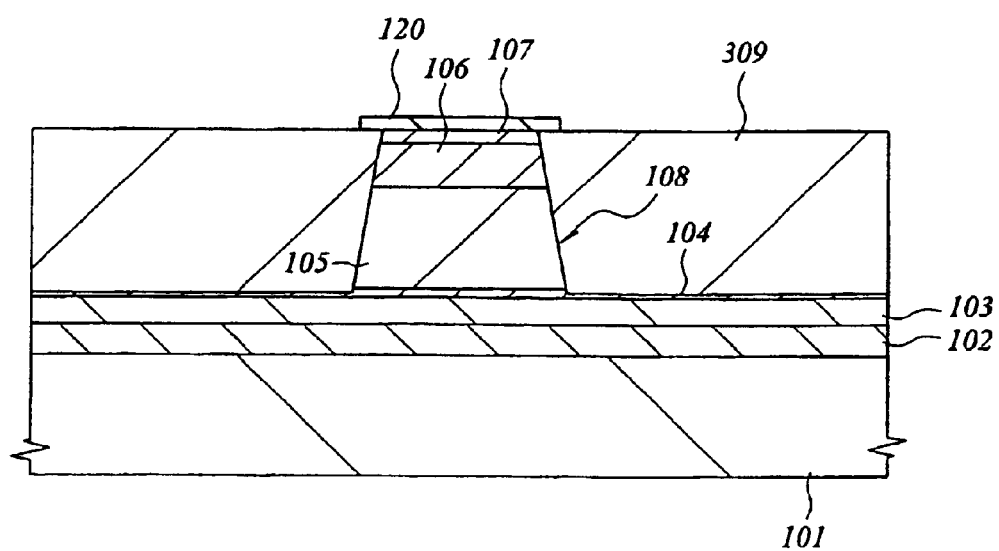
FIG. 16 is a cross-sectional view of a primary portion of a semiconductor substrate for illustrating a manufacturing method of a semiconductor photodetector that is another embodiment of the present invention.

First, as illustrated in FIG. 16, in accordance with the steps illustrated in FIGS. 1 to 3 of Embodiment 1 described above, a first mesa 108 is formed on a substrate 101, and a regrown layer 309 made of p-type InP crystal is then made to selectively grow on the substrate 101 around the first mesa 108 by using the MBE method. At this time, by controlling such growing conditions that the regrown layer 309 is formed also in the lower region of the hard mask 120 overhanging the sidewall of the first mesa 108, the regrown layer 309 is formed so that the entire surface including a vicinity of each sidewall of the first mesa 108 becomes flat. When the regrown layer 309 is made to grow under such condition, a part of the regrown layer 309 directly grows from the cap layer 106 of the first mesa 108 and so defects occur in the inside thereof.

Next, as illustrated in FIG. 17, after the hard mask 120 is removed, a photoresist film 123 to which a peripheral portion of the contact layer 107 is exposed is formed on each upper portion of the contact layer 107 and the regrown layer 309.

Next, as illustrated in FIG. 18, the photoresist film 123 is used as a mask to performing etching to respective peripheral portions of the contact layer 107 and the cap layer 106, and thereby each groove 311 is formed which reaches a bottom portion of the cap layer 106 and has a depth of approximately 1am and a width of approximately 2 μm is formed that reaches a bottom portion of the cap layer 106. This etching is performed such that a phosphoric acid system etching liquid is used, and such that the contact layer 107 and the cap layer 106 are selectively etched and the regrown layer 309 is not etched by utilizing the difference between an impurity density of a crystal constituting the regrown layer 309 and impurity densities of crystal layers (the contact layer 107 and the cap layer 106) exposed to respective sidewalls of the first mesa 108.

Figure 19:
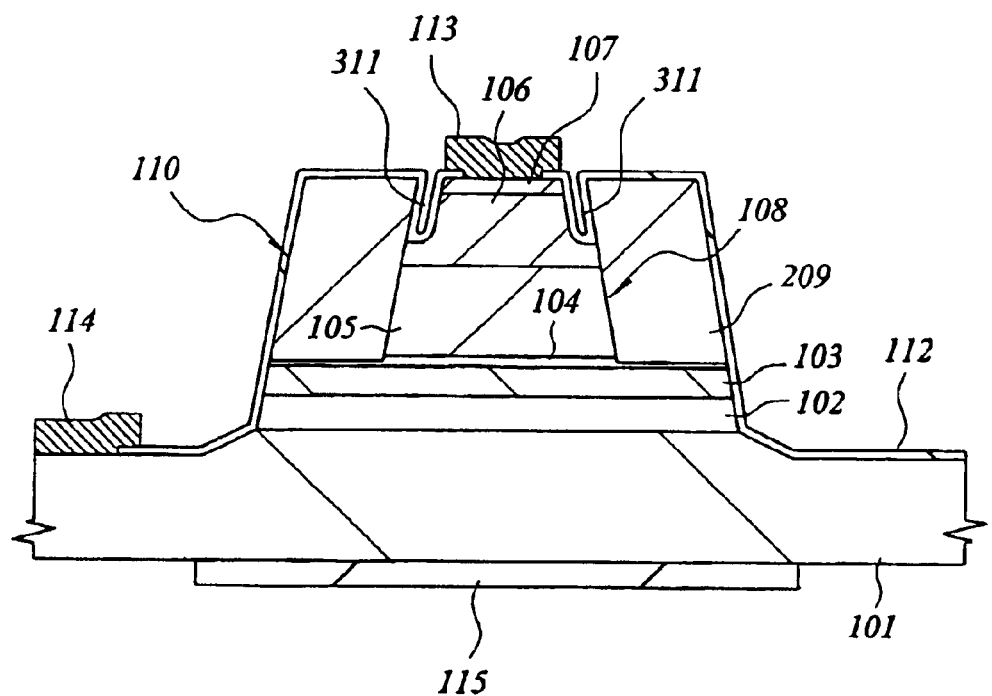
FIG. 19 is a cross-sectional view of a primary portion of a semiconductor substrate for illustrating a manufacturing method of a semiconductor photodetector that is another embodiment of the present invention.

Next, as illustrated in FIG. 19, after the photoresist film 123 is removed, in accordance with the steps illustrated in FIGS. 5 to 8 of Embodiment 1 described above, a second mesa 110, a protecting film 112 and electrodes 113 and 114 are formed on and over the substrate 101, and a reflection protecting film 115 is formed on the rear surface of the substrate 101, and thereby an avalanche photodiode chip is completed.

When a reverse bias through the electrodes of the wiring substrate was applied to the avalanche photodiode that is the present embodiment and that is manufactured in the above-described manner, a breakdown voltage (Vb) thereof was 30V and a dark current corresponding to 27V was 10 nA and a multiplication factor of an optical signal was 90 at maximum. A high temperature reverse-bias test was executed for about 1000 hours (with 200° C. and 100 μA constant), and, as a result, each value of the breakdown voltage, the dark current and the multiplication factor had no change and was good.

In the avalanche photodiode of the present embodiment, similarly to the avalanche photodiodes of Embodiments 2 and 3 described above, a part of the regrown layer 309 directly grows from the cap layer 106 in the step of forming the regrown layer 309, and so defects occur in the inside thereof. However, each groove 311 is formed in the regrown layer 309 surrounding the cap layer 106 in the step performed later, and thereby the cap layer 106 and the regrown layer 309 are made non-continuous. Therefore, no current path is formed between the cap layer 106 and the regrown layer 309, and an avalanche photodiode having high reliability and a small dark current can be realized.

(Embodiment 5)

In Embodiment 1 described above, the regrown layer 109 around the first mesa 108 has been made of p-type InP crystal, but may be made of semi-insulating type InP crystal or p-type InAlAs crystal. In this case, since the manufacturing method of an avalanche diode is the same as that in Embodiment 1 described above, the explanations thereof will be omitted.

When a reverse bias through the electrodes of the wiring substrate was applied to the avalanche photodiode of the present embodiment, a breakdown voltage (Vb) thereof was 30V and dark currents corresponding to 27V and 20V were respectively 20 nA and 1 nA even in the case where the regrown layer 109 was made of a semi-insulating type InP crystal and in the case where it was made of p-type InP crystal. Also, a multiplication factor of an optical signal was 90 at maximum. Further, a high temperature reverse-bias test was executed for about 1000 hours (with 200° C. and 100 μA constant), and, as a result, each value of the breakdown voltage, the dark current and the multiplication factor had no change and was good.

For purpose of comparison, when the regrown layer 109 was made of the above-mentioned material (semi-insulating type InP crystal or p-type InAlAs crystal) and a reverse bias was applied to the avalanche photodiode in which each groove 111 was not formed around the first mesa 108, the breakdown voltage was 28V and the dark currents corresponding to 27V and 20V were respectively 2 μA and 500 nA even in the case where regrown layer 109 was made of a semi-insulating type InP crystal and in the case where it was made of p-type InP crystal. In the high temperature reverse-bias test, degradation was found in that the breakdown voltage decreased by 2V after 50 hours elapsed and the dark current of 20V increased to 3 μA and the duplicating rate decreased to 10.

It has been found from the above-mentioned results that an avalanche photodiode having high reliability and a small dark current can be realized by forming the groove 111 around the first mesa 108, irrespective of the material of the regrown layer 109 or a conductive type thereof.

(Embodiment 6)

An avalanche photodiode of the same shape as that of Embodiment 1 described above was manufactured by reversing conductive types of the substrate 101 and the crystal layers (102 to 107). More particularly, the substrate 101 was made of p-type InP crystal; the buffer layer 102 was made of p-type InAlAs crystal; the multiplication layer 103 was made of p-type InAlAs crystal; the field control layer 104 was constituted by the laminated structure of n-type InAlAs crystal and n-type InGaAs crystal; the absorption layer 105 was made of n-type InGaAs crystal; the cap layer 106 was made of n-type InAlAs crystal; and the contact layer 107 was made of n-type InGaAs crystal, respectively. Each film forming method, each impurity density and each film thickness of the crystal layers (102 to 107) were set to be the same as those of Embodiment 1 described above. Also, the regrown layer 109 was constituted by n-type InP crystal, and the film forming method, the impurity density and the film thickness thereof were set to be the same as those of Embodiment 1 described above. Since the manufacture method thereof is the same as that of Embodiment 1 described above, the explanation thereof will be omitted.

When a reverse bias through the electrodes of the wiring substrate is applied to the avalanche photodiode of the present embodiment, a breakdown voltage (Vb) thereof was 30V and dark currents corresponding to 27V and 20V were 20 nA and 1 nA, respectively. Also, a multiplication factor of an optical signal was 90 at maximum. Further, a high temperature reverse-bias test was executed for about 1000 hours (with 200° C. and 100 μA constant), each value of the breakdown voltage, the dark current and the multiplication factor had no change and was good.

For purpose of comparison, when the crystal layers (102 to 107) and the regrown layer 109 were constituted by the above-mentioned materials and a reverse bias was applied to the avalanche photodiode in which each groove 111 was not formed around the first mesa 108, the breakdown voltage thereof was 28V and the dark currents corresponding to 27V and 20V were 2 $\mu$A and 500 nA, respectively. In the high temperature reverse-bias test, degradation was found in that the breakdown voltage decreased by 2V after 50 hours elapsed and the dark current corresponding to 20V increased to 3 $\mu$A and the duplicating rate decreased to 10.

It has been found from the above-mentioned results that an avalanche photodiode having high reliability and a small dark current can be realized by forming each groove 111 around the first mesa 108, irrespective of conductive types of the substrate 101, the crystal layers (102 to 107) and the regrown layer 109.

(Embodiment 7)

An avalanche photodiode was manufactured similarly to the Embodiment 2 except for the fact that the planar shapes of the first mesa 108 and the second mesa 110 were changed to rectangular shapes.

Upon impressing reverse bias to the avalanche photodiode of the present embodiment manufactured in the above-described manner through electrodes of the wiring substrate, it was found that a breakdown voltage (Vb) thereof was 30V, and that dark current of 27V was 20 nA. A multiplication factor of optical signals was 90 at maximum. Upon performing a high temperature reverse-bias test for around 1,000 hours (200° C., 100 $\mu$A constant), it was found that no changes were caused in the breakdown voltage, the dark current and the multiplication factor and was thus favorable.

For purpose of comparison, reverse bias was impressed to an avalanche photodiode manufactured by the same method as the avalanche photodiode of the present embodiment except for the fact that no groove 211 was formed surrounding the first mesa 108, and it turned out that the breakdown voltage was 28V, and the dark current of 25V was 20 $\mu$A. Degradation was found in that the multiplication factor decreased to 10.

It was found from the above results that it is possible to realize an avalanche photodiode of high reliability and small dark current by forming each groove 211 around the first mesa 108, irrespective of the planar shape of the mesas (108 and 110).

(Embodiment 8)

Figure 20:
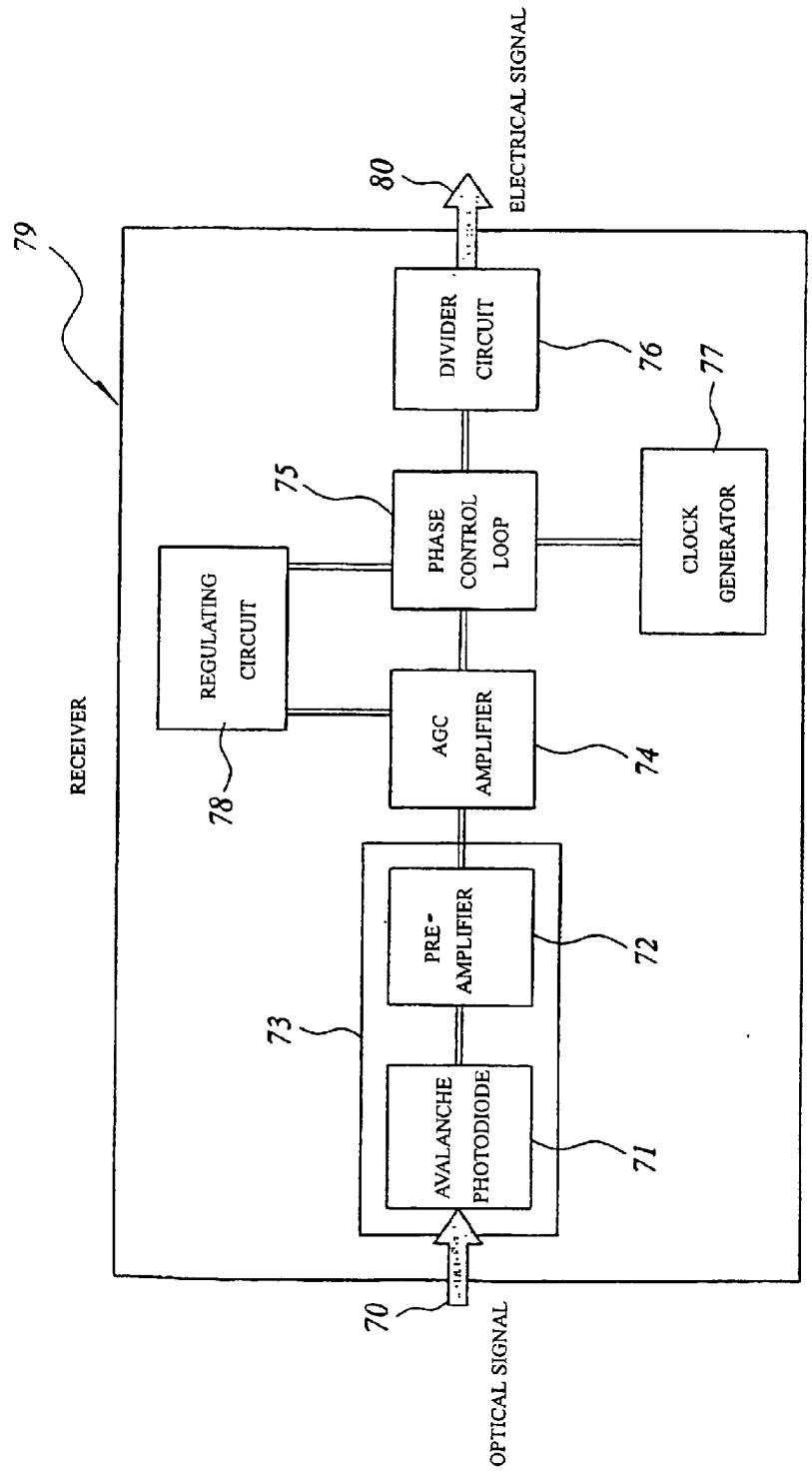
FIG. 20 is a block diagram of a receiver employing a semiconductor photodetector that is another embodiment of the present invention.
Figure 21:
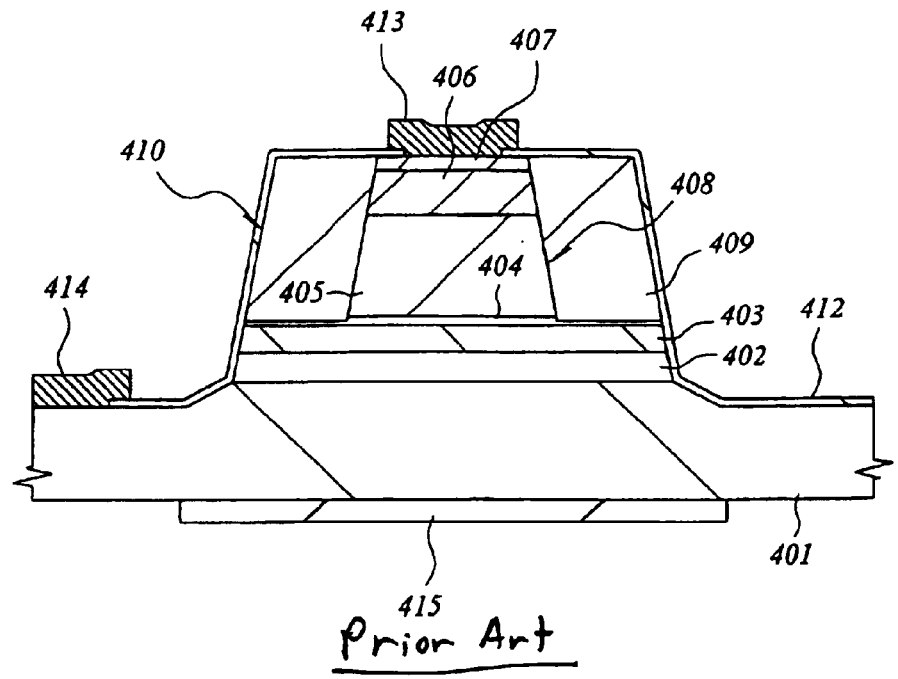
FIG. 21 is a cross-sectional view of a primary portion of a semiconductor substrate illustrating a conventional semiconductor photodetector.
Figure 22:
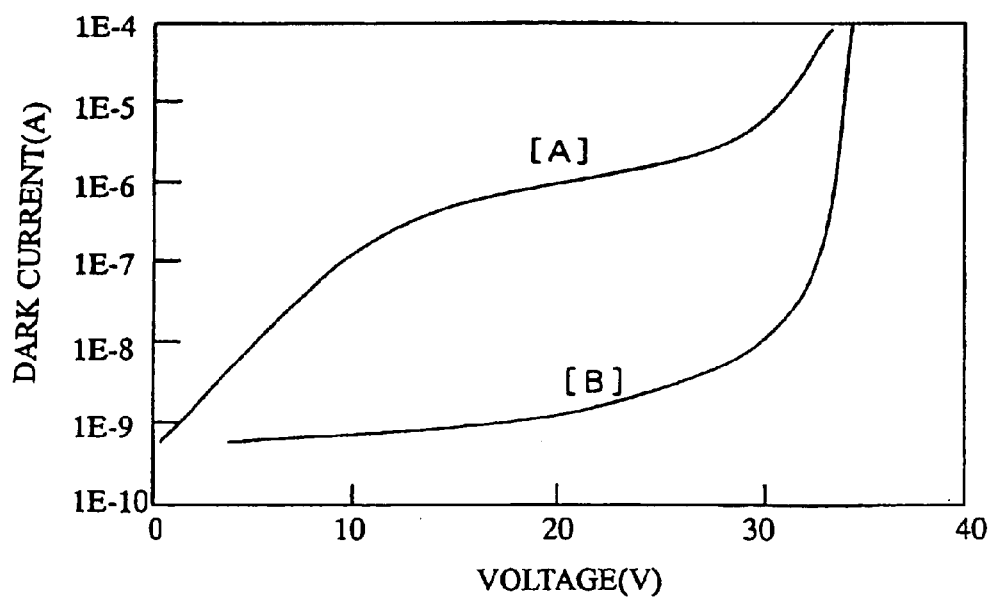
FIG. 22 is a graph illustrating dark current-voltage characteristics of a semiconductor photodetector provided with an regrown layer around a first mesa.

FIG. 20 is a block diagram of a receiver utilizing the avalanche photodiode of Embodiment 2 described above.

The receiver 79 comprises: a front-end module 73 including an avalanche photodiode 71 and a preamplifier 72; an AGC amplifier 74 following it; a phase control loop 75; a divider circuit 76; a clock generator 77; and an regulating circuit 78.

An optical signal 70 was input to the avalanche photodiode 71 of the above-mentioned receiver 79 through an optical fiber. As a result of obtaining an electrical signal 80, a sensitivity was −27 dBm (BER: Bit Error Raito=1×10$^{-12}$). Further, as a result of a test, it has been found that the reliability of the receiver 79 is ensured for more than 20 years.

For purpose of comparison, except for the use of an avalanche photodiode of the conventional structure in which each groove 211 was not formed around the first mesa 108, an optical signal was input into a receiver having the same structure as that of the above-mentioned receiver 79. As a result of taking out an electrical signal, a sensitivity was −26 dBm. This is because the dark current of the avalanche photodiode 71 used in the above-mentioned receiver 79, especially the duplicating dark current is $\frac{1}{100}$ of that of the conventional avalanche photodiode and so is small and thereby the reliability thereof is good.

(Embodiment 9)

The present embodiment has been applied to a photodetector comprising a pin photodiode, and a structure and a manufacturing method thereof is the same as that of the avalanche photodiode of Embodiment 2 described above, except for the fact that the multiplication layer 103 and the field control layer 104 are not provided and so the illustrations thereof have been omitted.

When a reverse bias through the electrodes of the wiring substrate was applied to the pin photodiode of the present embodiment, a dark current corresponding to 10V was 1 nA. Also, a high temperature reverse-bias test was executed for about 1000 hours (with 200° C. and 100 $\mu$A constant), and, as a result, a value of the dark current had no changed and was good.

For purpose of comparison, except for the fact that each groove 211 was not formed around the first mesa 108, a dark current corresponding to 10V of a pin photodiode manufactured in the same method as the pin photodiode of the present embodiment was 5 $\mu$A. In a high temperature reverse-bias test, degradation also was found in that the breakdown voltage decreased by 2V after 50 hours elapsed.

It has been found from the above-mentioned results that no current path is formed between the cap layer 106 and the regrown layer 209 by forming each groove 211 around the first mesa 108 and so a pin photodiode having high reliability and a small dark current can be realized even when the present embodiment is applied to the pin photodiode.

As described above, the invention(s) made by the present inventors has been described in details on the basis of the embodiments of the invention, but the present invention is not limited to the above-mentioned embodiments and, needless to say, can be variously changed and modified without departing from the gist thereof.

For example, the method for forming the grooves around the first mesa can be variously changed and may employ a dry etching method or a method in which any films are physically removed. Also, it is desirable that each bottom portion of the grooves reaches the bottom portion of the crystal layer containing Al (cap layer) but may be somewhat shallower. Each planar shape of the first mesa and the grooves formed around the first mesa can be variously changed.

In the above-mentioned embodiments, the description has been made of the case where the present invention is applied to the avalanche photodiode or pin photodiode that is of particular importance in the field of optical communication. However, the present invention can be widely applied to the mesa-type semiconductor photo-acceptance device utilizing compound semiconductors and having an embedding type structure.

Advantages obtained by representative ones from among the inventions disclosed in the present application will be briefly described as follows.

By reducing defects in the regrown layer, which are caused by the Al containing compound semiconductor layer in each side surface of the mesa, or by eliminating connections with the compound semiconductor layer having a high carrier density, the mesa type semiconductor photodetector having the embedded structure and utilizing the compound semiconductor can reduce a dark current and improve reliability thereof. As a result, the mesa-type semiconductor photodetector having a small dark current and high reliability, which has not been manufactured by the prior arts, can be provided in a simple manner and at low cost, and so is of industrially importance.

What is claimed is:

1. A semiconductor photodetector comprising:
   a pn junction formed by a first compound semiconductor layer of first conductivity type formed on a semiconductor substrate and a second compound semiconductor layer of second conductivity type formed on an upper portion of said first compound semiconductor layer of first conductivity type;
   a first mesa including at least a portion of said second compound semiconductor layer of second conductivity type, said first mesa having bottom portion that extends to said pn junction;
   a second mesa including a regrown layer formed around said first mesa, the regrown layer being made of a compound semiconductor crystal said second mesa having a bottom portion that extends at least to said pn junction; and
   a groove that is provided in a vicinity of the boundary between said regrown layer and said first mesa, said groove having a bottom portion that extends to said pn junction.

2. The semiconductor photodetector according to claim 1, wherein said second compound semiconductor layer of second conductivity type constituting said first mesa includes a compound semiconductor crystal containing aluminum,
   wherein said raise mesa further includes an absorption layer, a cap layer, a contact layer.

3. The semiconductor photodetector according to claim 2, wherein an impurity density of said compound semiconductor crystal containing aluminum is higher than that of said compound semiconductor crystal constituting said regrown layer.

4. The semiconductor photodetector according to claim 1, wherein a height of an upper surface of said first mesa is substantially the same as that of an upper surface of said regrown layer.

5. The semiconductor photodetector according to claim 1, wherein said groove is formed by removing a part of said first mesa.

6. The semiconductor photodetector according to claim 1, wherein the groove is formed by removing a part of said regrown layer.

7. The semiconductor photodetector according to claim 1, wherein said groove as formed by removing each part of said regrown layer and said first mesa.

8. The semiconductor photodetector according to claim 1, wherein said groove is formed by restricting growth of said regrown layer in a vicinity of the boundary between said groove and said first mesa.

9. The semiconductor photodetector according to claim 1, wherein said semiconductor photodetector is an avalanche photodiode.

10. The semiconductor photodetector according to claim 1, wherein said semiconductor photodetector is a pin photodiode.

11. The semiconductor photodetector according to claim 1, wherein said second compound layer of second conductivity type constituting said first mesa includes a compound semiconductor crystal containing aluminum, wherein said first mesa does not contact said pn junction.

12. The semiconductor photodetector according to claim 1, wherein an impurity density of said compound semiconductor crystal containing aluminum is higher than that of said compound semiconductor crystal constituting said surronding layer.

13. The semiconductor photodetector comprising:
    a pn junction formed by a first compound semiconductor layer of first conductivity type formed on a semiconductor substrate and a second compound semiconductor layer of second conductivity type formed on an upper portion of said first compound semiconductor layer of first conductivity type;
    a first mesa including a contact layer, a cap layer, an absorption layer, and at least a portion of said second compound semiconductor layer, said first mesa being formed over said first compound semiconductor layer and having no portion that extends to said pn junction;
    a second mesa including a surrounding layer formed around said first mesa, the surrounding layer being made of a compound semiconductor crystal and having a bottom portion that extends below said pn junction; and
    a groove that is provided in a vicinity of the boundary between said surrounding layer and said first mesa, said groove having no portion that extends to said pn junction.

14. The semiconductor photodetector according to claim 13, wherein a height of an upper surface of said first mesa is substantially the same as that of an upper surface of said surrounding layer.

15. The semiconductor photodetector according to claim 13, wherein said groove is formed by removing a part of said first mesa.

16. The semiconductor photodetector according to claim 13, wherein the groove is formed by removing a part of said surrounding layer.

17. The semiconductor photodetector according to claim 13, wherein said groove formed by removing each part of said surrounding layer and said first mesa.

18. The semiconductor photodetector according to claim 13, wherein said groove as formed by restricting growth of said surrounding layer in a vicinity of the boundary between said groove and said first mesa.

19. The semiconductor photodetector according to claim 13, wherein said semiconductor photodetector is an avalanche photodiode.

20. The semiconductor photodetcctor according to claim 13, wherein said semiconductor photodetector is a pin photodiode.

* * * * *